(12) United States Patent
Masterton et al.

(10) Patent No.: US 6,819,131 B2
(45) Date of Patent: Nov. 16, 2004

(54) PASSIVE, GREASE-FREE COOLED DEVICE FIXTURES

(75) Inventors: Patrick Masterton, Carol Stream, IL (US); Martin R. Pais, North Barrington, IL (US)

(73) Assignee: Motorola, Inc., Schaumburg, IL (US)

(*) Notice: Subject to any disclaimer, the term of this patent is extended or adjusted under 35 U.S.C. 154(b) by 166 days.

(21) Appl. No.: 10/193,053

(22) Filed: Jul. 11, 2002

(65) Prior Publication Data

US 2004/0008047 A1 Jan. 15, 2004

(51) Int. Cl.$^7$ ................................................ G01R 31/02
(52) U.S. Cl. ...................................... 324/760; 324/158.1
(58) Field of Search ................................. 324/760, 765, 324/158.1; 165/80.2, 80.3, 80.4, 80.5; 219/444.1

(56) References Cited

U.S. PATENT DOCUMENTS

| | | | | |
|---|---|---|---|---|
| 5,001,423 A | * | 3/1991 | Abrami et al. | 324/760 |
| 5,034,688 A | * | 7/1991 | Moulene et al. | 324/760 |
| 6,104,203 A | * | 8/2000 | Costello et al. | 324/760 |
| 6,156,271 A | | 12/2000 | May | 422/58 |
| 6,583,638 B2 | * | 6/2003 | Costello et al. | 324/760 |
| 6,636,062 B2 | * | 10/2003 | Gaasch et al. | 324/760 |

* cited by examiner

Primary Examiner—Kamand Cuneo
Assistant Examiner—Tung X. Nguyen
(74) Attorney, Agent, or Firm—Marshall, Gerstein & Borun LLP

(57) ABSTRACT

A technique for enhancing thermal coupling between a device and a thermally conductive material includes using porous portions to draw fluid through conduits. Capillary action then draws fluid from the porous portion into a space between the device and the thermally conductive material to provide a fluid layer between the device and the thermally conductive material.

32 Claims, 4 Drawing Sheets

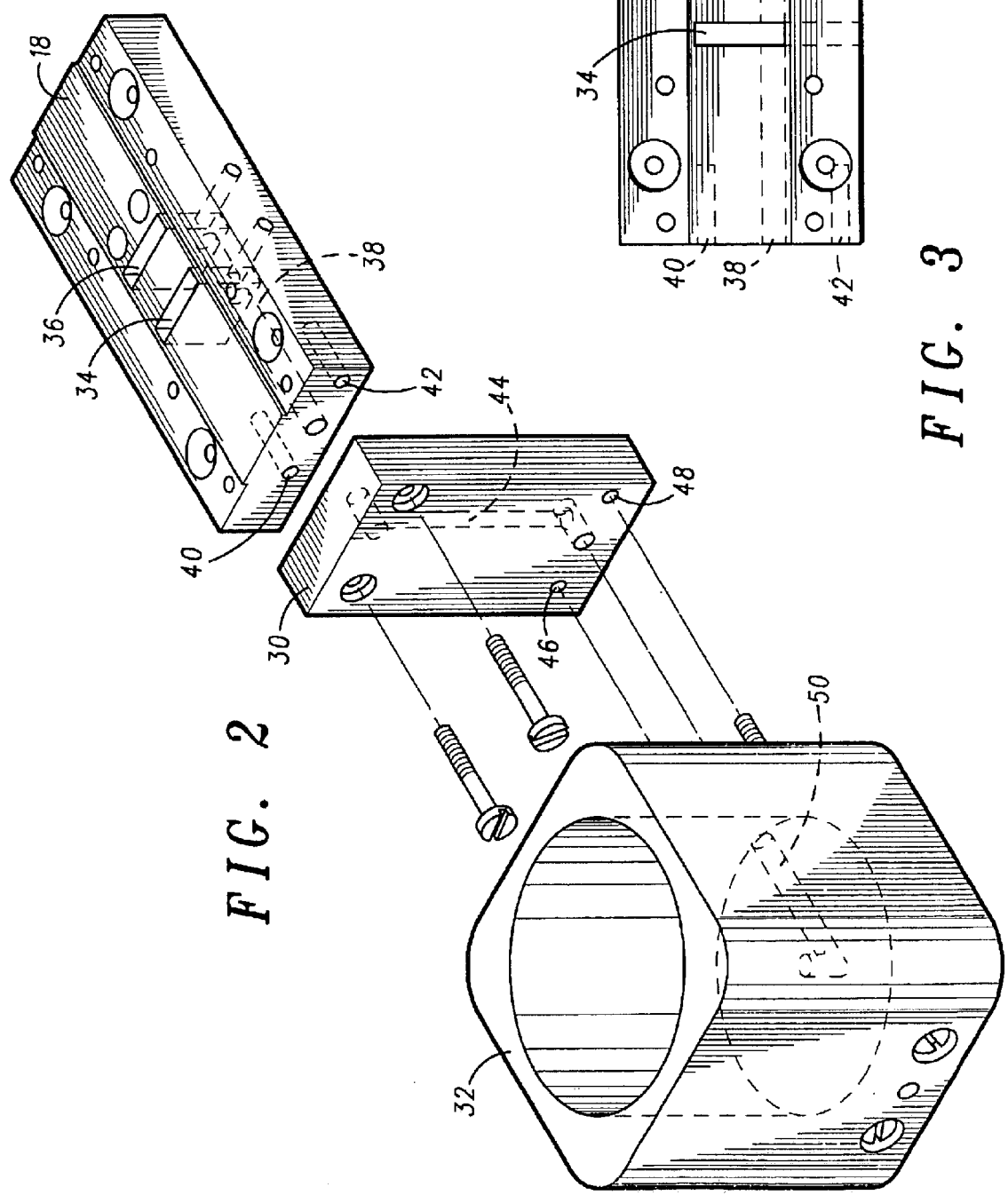

PASSIVE, GREASE-FREE COOLED DEVICE FIXTURES

TECHNICAL FIELD

The present invention pertains to device fixtures and, more particularly, to cooled device fixtures.

BACKGROUND

Many semiconductor devices, such as, for example, radio frequency (RF) semiconductor devices, are manufactured in factories including equipment for individually testing the electrical performance of each device. One such test is commonly referred to as a burnout test in which heat dissipation and thermal conditions under which the device is operated may be extreme and may lead to device failure if the device is not adequately cooled during testing. Because devices that are individually tested tend to sell for relatively high prices, any yield degradation caused by testing directly impacts the profit of the company. For example, for every $100 RF device damaged at test, the company will not realize the $100 of revenue from the sale of that device.

Presently, when devices are individually tested, each device is placed in a specially designed cooling fixture including a conduction-cooled heat sink that may have an associated fan. After the device has been placed on the cooling fixture, it is clamped into place to prevent movement of the device and to allow the device under test to conduct heat to the cooling fixture. It is not uncommon for the device to be clamped into the cooling fixture with a clamp force of as much as 30 pounds (lbs.), which can lead to unintended damage of potentially fragile parts or structures inside the device. Additionally, the 30 lb. force can be unwieldy and difficult to control.

Because the device and the test fixture are not perfectly planar, there exists a small gap between the bottom face of the device being tested and the top of the cooling fixture when the device is placed on the cooling fixture. For example, the gap may be due to surface roughness and features on each of the mating interfaces. The air gap between the device under test and the cooling fixture inhibits thermal conduction between the device and the fixture, thereby preventing the device from easily coupling its heat to the cooling fixture and resulting in device heating that may result in increased device die temperature. Accordingly, to enhance the thermal conduction path between the device and the cooling fixture, a thin layer of thermally conductive grease such as, for example, Wakefield grease is commonly applied to the contact surface of the device before the device is clamped into place on the cooling fixture. Such grease is a non-water soluble thermal conductor. While the Wakefield grease aids in thermal conduction, grease thickness and air pockets in the grease may lead to inconsistent or unpredictable thermal conduction during device testing.

After testing of the device is complete, the clamp holding the device to the fixture is released and the device is manually removed from the fixture using equipment such as tweezers. An operator then uses cotton swabs and a methanol based solvent to remove the grease from the device that has been tested and the device is placed into a sorting bin representative of the electrical characteristics of the device. Care must be taken to ensure that all grease residue is removed from devices because, once purchased, devices are commonly soldered into place as parts of systems or subsystems. Failure to remove absolutely all of the Wakefield grease residue from the device would contaminate the soldering process, thereby yielding cold solder joints, poor bonding and potentially open circuits. In practice, however, some of the grease residue will always remain on the device. Whether such residue affects manufacturing processes depends on the quantity of residue.

As will be readily appreciated, the foregoing process requires manual labor to apply the Wakefield grease to the device to be tested and to remove the grease from the device after testing is complete. Because certain devices are 100 percent tested (i.e., each device leaving the factory is tested) the manual labor costs associated with device testing could be considerable. In fact, while electrical testing of devices may require on the order of 50 seconds of testing time, the manual labor associated with applying the Wakefield grease to the device before testing and removing the same from the device after testing may equal the test time, thereby doubling the process time for testing a device. Accordingly, not only is the use of the Wakefield grease expensive in terms of manual labor costs, it is expensive in terms of product throughput time. Furthermore, some grease residue will always remain on the device, which could affect the processing of the device by the purchaser.

BRIEF DESCRIPTION OF THE DRAWINGS

FIG. 2 is an exemplary assembly view of the reservoir, coupler and fixture insert of FIG. 1;

FIGS. 3–5 are exemplary plan, side elevational and end elevational views, respectively, of the fixture insert of FIGS. 1 and 2;

Figure 1:
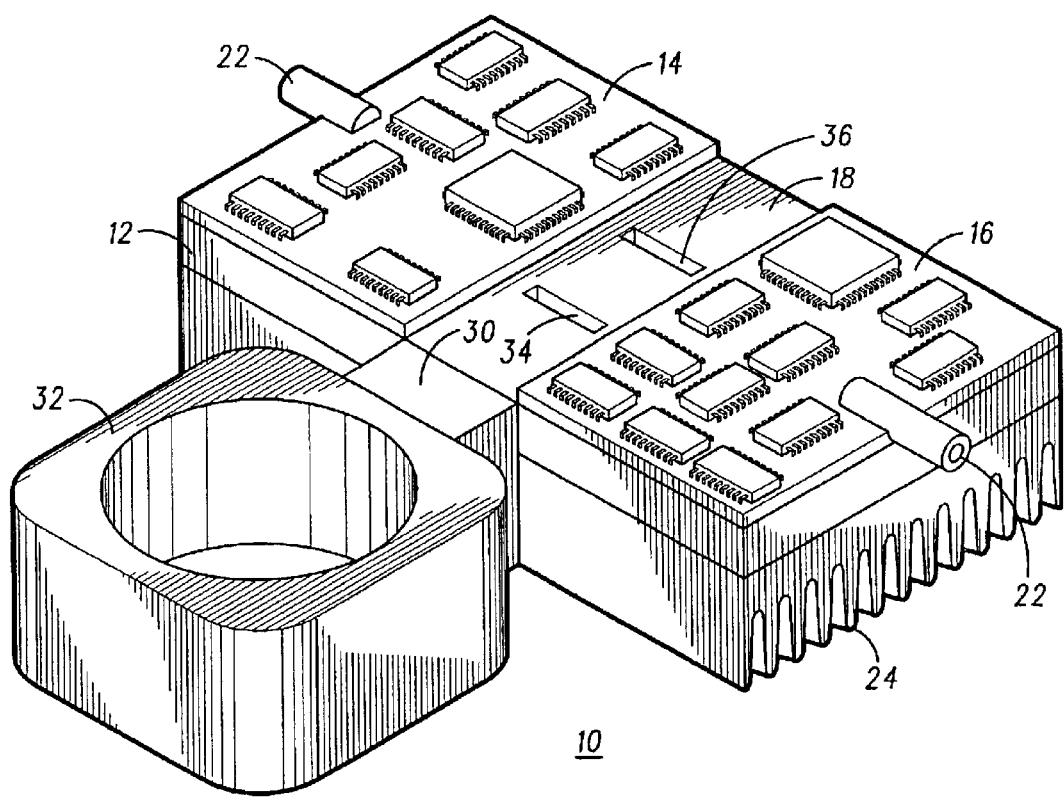
FIG. 1 is an exemplary isometric view of a test fixture.
Figure 4:
Figure 5:
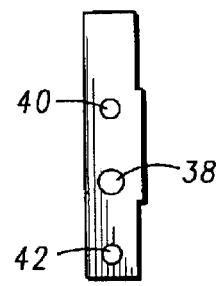
Figure 6:
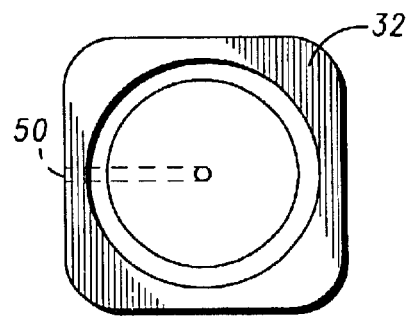
FIGS. 6–8 are exemplary plan, side elevational and end elevational views, respectively, of the reservoir of FIGS. 1 and 2.
Figure 8:
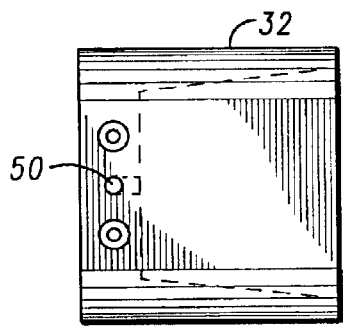
Figure 7:
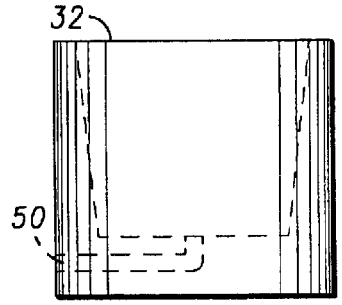
Figure 10:
FIGS. 9–11 are plan, side elevational and end views of the coupler of FIGS. 1 and 2.
Figure 9:
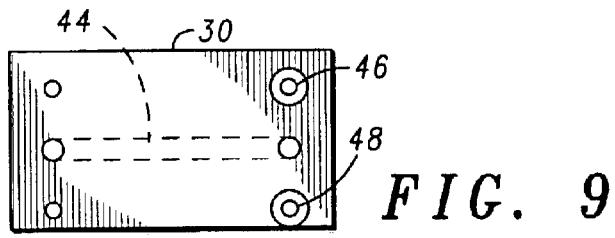
Figure 11:
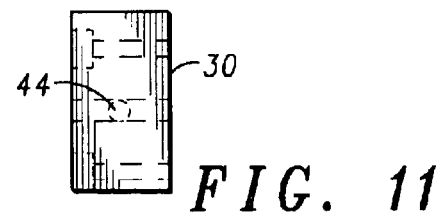

In the following description, common reference numerals refer to common structures of features.

DETAILED DESCRIPTION

Turning now to FIG. 1, a test fixture 10 generally includes a block 12 on which first and second test circuits 14, 16 may be fastened and in which a fixture insert 18 may be installed. The test fixture 10 may also include input/output ports 22 that may be coupled to the first and second test circuits 14, 16 to provide signals thereto or to receive signals therefrom. A heat sink 24, such as a finned heat sink, may also be mounted to the block 12 to enable the block 12 to more rapidly dissipate heat that may be generated by a device under test. In general, both block and finned heat sinks may be fabricated from good thermal conductors such as copper, aluminum and the like. The test fixture 10 may also include a coupler 30 that is fastened between the fixture insert 18 and a reservoir 32 adapted to hold a fluid, such as, for example, distilled water. As described below in further detail, the fluid may be used to cool a device placed on the fixture insert 18.

For ease of explanation, only the fixture insert 18, the coupler 30 and the reservoir 32 are shown in FIG. 2. The fixture insert 18 includes first and second porous portions 34, 36 that are inserted into apertures or slots in the fixture insert 18. The fixture insert 18 also includes a conduit 38 in fluid communication with each of the slots and the porous portions 34, 36. Threaded bores 40, 42 are provided in the fixture insert 18 to accommodate screws that fasten the coupler 30 to the fixture insert 18. A first O-ring (not shown) may be used to seal a conduit 44 in the coupler 30 to the conduit 38 of the fixture insert 18. The coupler 30 also includes threaded bores 46, 48, or any other suitable features, to accommodate screws that fasten the reservoir 32 to the coupler 30. The reservoir 32, which is adapted to hold a liquid such as, for example, distilled water, also includes a conduit 50 in fluid communication with the conduit 44 of the coupler, thereby putting the reservoir 32 in fluid communication with the porous portions 34, 36. A second O-ring (not shown) may be provided between the reservoir 32 and the coupler 30 to seal the junction between the conduit 50 of the reservoir 32 and the conduit 44.

Optionally, a wicking member may be disposed within the vertical portion of the conduit 44 to aid the capillary effect in wicking the fluid from the reservoir 32 up to the conduit 38 of the fixture insert 18. For example, a threaded shaft of a bolt having an outer diameter smaller than the diameter of the conduit 44 may be placed within the conduit 44 to enhance the capillary effect.

In one exemplary embodiment, the fixture insert may have dimensions of 1.25 inches by 3 inches and the slots or apertures for receiving the porous portions 34, 36 may have dimensions of 0.5 inches by 0.1 inches. Additionally, the radius of the conduit 38 and the fixture insert 18 may be 0.07 inches and the conduits 44, 50 may be similarly sized.

The porous portions 34, 36 may be separately milled and inserted into the fixture insert 18 by a friction or interference fit or by any other suitable methods including adhesives or mechanical fasteners. The porous portions 34, 36 may be fabricated from, for example, sintered metals such as titanium, brass, copper, stainless steel or other metals that will not react or corrode when exposed to the reservoir fluid, which may be, for example, distilled water or any other non-residue fluid. Alternatively, the porous portions 34, 36 could be fabricated from screen material, metal cloth, plastic or any other suitable synthetic or natural that would act as a wick.

In operation, due to the capillary effect, fluid from the reservoir 32 passes through the conduit 50 to the conduit 44 and from the conduit 44 to the conduit 38. Upon reaching the conduit 38, the porous portions 34, 36 wick the water from the conduit 38 up to the top faces of the porous portions, which are disposed substantially co-planar with the top face of the fixture insert 18. Because it is a capillary effect that draws the fluid from the reservoir 32 to the porous portions 34, 36, the reservoir 32 may be located at a position lower than the fixture insert 18. Additionally, while the fixture insert 18 is shown in FIGS. 1 and 2 as being horizontally oriented with the faces of the porous portions 34, 36 facing upwards, the test fixture 10 and its fixture insert 18 may be oriented at any suitable angle and the capillary effect that draws the water from the reservoir 32 to the porous portions 34, 36 will continue to operate. Furthermore, even if the faces of the porous portions 34, 36 are oriented to be downwards, water will not leak from the porous portions 34, 36 due to the capillary effect and the surface tension of the fluid within the porous portions 34, 36. Accordingly, the arrangement of the reservoir 32, the coupler 30 and the fixture insert 18 shown in FIGS. 1 and 2 is merely exemplary and other arrangements of these components is contemplated. In fact, it is possible to eliminate the coupler 30 in favor of directly connecting the reservoir 32 to the fixture insert 18.

Figure 12:
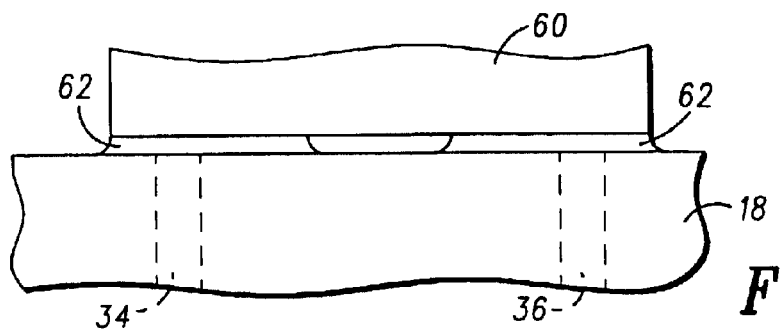
FIGS. 12 and 13 are exemplary elevational views of a device disposed on the fixture insert of the foregoing drawings.
Figure 13:
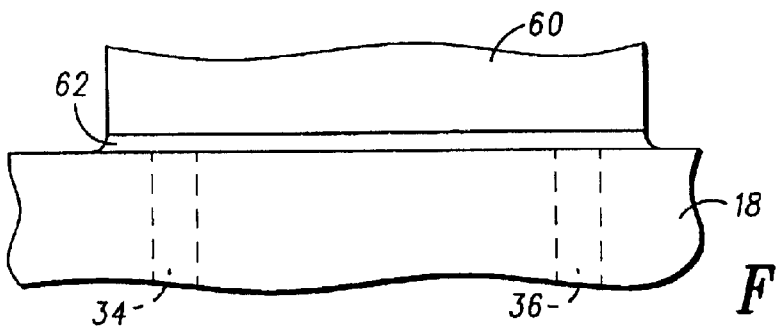

To this point the operation of the capillary effect to wick water from the reservoir 32 through the coupler 34 and up to the upper faces of the porous portions 34, 36 has been described. However, with reference to FIGS. 12 and 13, a secondary capillary effect is described, whereby water from the porous portions 34, 36 is wicked across an interface between the fixture insert and a device under test 60, which may be, for example, a semiconductor device or any other device. As shown in FIG. 12, the interface between the device under test 60 and the fixture insert 18 is shown as being partially filled with fluid 62. Although FIG. 12 shows the fluid 62 as occupying only a portion of the interface between the device under test 60 and the fixture insert 18, it will be readily understood that such an illustration is merely for instructional purposes and, in practice, the fluid from the porous portions 34, 36 would wick across the entire interface between the device under test 60 and the fixture insert 18 as shown in FIG. 13.

Accordingly, the second capillary effect, which wicks water between the device under test 60 and the fixture insert 18 aids in conducting heat from the device under test 60 into the fixture insert 18, which in turn passes heat to the block 12 that includes the heat sink 24. Additionally, the elimination of the thermal grease leaves the device 60 free from residue of non-water soluble thermal conductor, such as Wakefield grease.

Preliminary testing reveals that the use of the disclosed cooling technique can increase product test yield by as much as 10 percent and may save 30 percent on pre and post-preparation costs. Additionally, the use of the disclosed technique may enhance the die thermal transfer performance during device testing by as much as 45 percent over the use of the Wakefield grease technique. Further, the use of the disclosed technique may enhance package thermal conduction by as much as 47 percent over the use of the Wakefield grease technique. It has been estimated that the cost savings of the disclosed technique may be several hundreds of thousands of dollars across many product lines that are presently tested using the Wakefield grease technique.

Figure 14:
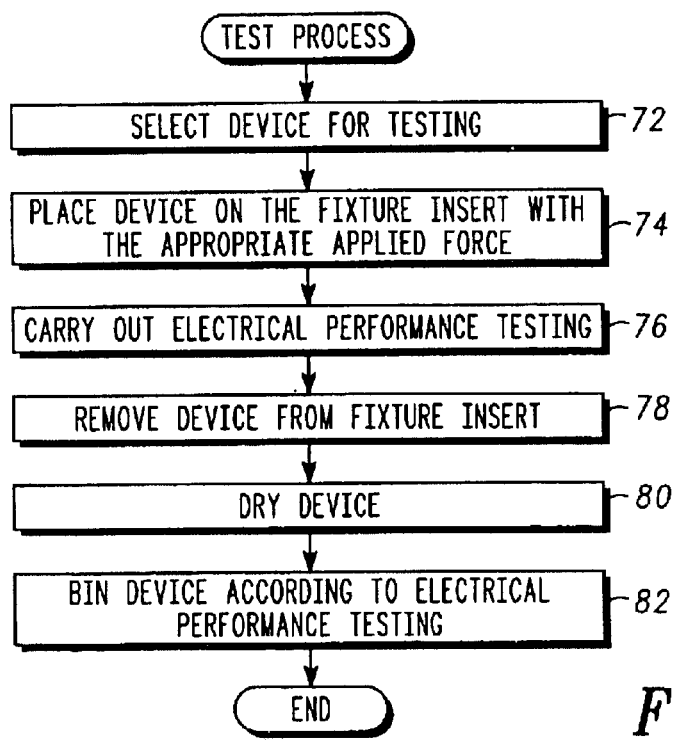
FIG. 14 is an exemplary flow diagram illustrating one manner in which the components of the foregoing drawings may be used to test devices.

Referring to FIG. 14, a test process 70 is shown. The test process 70 begins at block 72 during which a device is selected to be tested. The selection process may include a robotic arm (not shown) lifting a device to be tested from a tray using vacuum force to retain the device on the robotic arm. After the device to be tested has been selected at block 70, control passes to block 74, at which point the selected device is placed on the fixture insert with an appropriate amount of applied force. The applied force may be on the order of 5 lbs. and may, in fact, be provided by the robotic arm that selected the device in block 72 described above. Relevant to the prior disclosure of the capillary action carried out by the conduits 38, 44 and 50 and the interface between a device under test 60 and the porous portions 34, 36 of the fixture insert 18. After the device is placed on the fixture insert 18 with the appropriate force at block 74, the interface between the device 60 and the fixture insert 18 is filled with water by capillary action, thereby aiding the heat sinking of the device to the fixture insert 18.

After the device 60 has been placed on the fixture insert, block 76 carries out electrical performance testing, which may include any number of standardized electrical test or any other suitable tests. After the completion of electrical performance testing, control passes from block 76 to block 78 at which point the device 60 is removed from the fixture insert 18.

Block 78 may be carried out by the same robotic arm that was used in block 72 and block 74 to select the device and to place the appropriate amount of force on the device 60 during testing. After the device 60 has been removed from the fixture insert 18 at block 78 the device 60 is dried at block 80. Drying may be accomplished by any suitable means, such as, for example, dabbing the device 60 on an absorbent cloth or material or by heating the device 60 to cause the fluid to evaporate. After the device 60 is dried at block 80, the device 60 is binned at block 82 based on the results of the electrical performance testing carried out by block 76.

As will be readily appreciated from a review of FIG. 14 and its attendant description, the entire test process 70 has been described as automated and as not requiring human intervention. Of course, this is not necessarily required and human intervention could be used at any point in the test process 70. As will be further appreciated, the elimination of the Wakefield grease in the testing process eliminates the need to manually clean the tested device with any potentially hazardous chemicals thereby eliminating the cleaning step and the exposure of personnel to such chemicals. Additionally, the elimination of the cleaning step in favor of the drying step of block 80 reduces the time to execute the test process and yields a residue-free device after testing.

While the foregoing description is pertinent to cooling devices while they are being tested, it will be readily appreciated that the teachings and principles included herein are not strictly limited to device testing and may be applied to other situations that test situations. For example, it would be possible to use devices embodying the teachings disclosed herein to cool devices when devices are used in a circuit in the field.

Additionally, although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A fixture for cooling a device disposed thereon, comprising:
   a thermally conductive member comprising a mounting surface and a conduit, wherein the mounting surface comprises an aperture in fluid communication with the conduit;
   a reservoir in fluid communication with the conduit and adapted to provide fluid thereto; and
   a porous portion disposed within the aperture of the mounting surface and having face that is substantially co-planar with the mounting surface of the thermally conductive member, wherein the porous portion is adapted to draw fluid from the reservoir through the conduit and to provide a fluid layer beneath a device when the device is disposed on the thermally conductive layer in a position that overlaps the porous portion.

2. The fixture of claim 1, wherein the conduit is disposed within the thermally conductive member.

3. The fixture of claim 1, wherein the porous portion comprises a metallic material.

4. The fixture of claim 1, wherein the porous portion comprises a sintered material.

5. The fixture of claim 4, wherein the sintered material comprises a sintered metallic material.

6. The fixture of claim 5, wherein the sintered metallic material comprises titanium.

7. The fixture of claim 1, wherein the aperture comprises a slot.

8. The fixture of claim 1, wherein the aperture comprises an elongated cross section.

9. The fixture of claim 1, wherein the aperture is a first aperture and the porous portion is a first porous portion, the conductive member further comprising a second aperture in fluid communication with the conduit and a second porous portion disposed within the second aperture and wherein the second porous portion is adapted to draw fluid from the reservoir through the conduit.

10. The fixture of claim 1, wherein the porous portion wicks fluid from the conduit using a capillary action.

11. The fixture of claim 1, wherein the fluid comprises distilled water.

12. A fixture insert for use in a fixture having an associated reservoir, wherein the fixture is adapted to be used for cooling a device disposed thereon, comprising:
    a thermally conductive member comprising a mounting surface and a conduit, wherein the mounting surface comprises an aperture in fluid communication with the conduit;
    a porous portion disposed within the aperture of the mounting surface and having face that is substantially co-planar with the mounting surface of the thermally conductive member, wherein the porous portion is adapted to draw fluid from the reservoir through the conduit and to provide a fluid layer beneath a device when the device is disposed on the thermally conductive layer in a position that overlaps the porous portion.

13. The fixture insert of claim 12, wherein the conduit is disposed within the thermally conductive member.

14. The fixture insert of claim 12, wherein the porous portion comprises a metallic material.

15. The fixture insert of claim 12, wherein the porous portion comprises a sintered material.

16. The fixture insert of claim 15, wherein the sintered material comprises a sintered metallic material.

17. The fixture insert of claim 16, wherein the sintered metallic material comprises titanium.

18. The fixture insert of claim 12, wherein the aperture comprises a slot.

19. The fixture insert of claim 12, wherein the aperture comprises an elongated cross section.

20. The fixture insert of claim 12, wherein the aperture is a first aperture and the porous portion is a first porous portion, the conductive member further comprising a second aperture in fluid communication with the conduit and a second porous portion disposed within the second aperture and wherein the second porous portion is adapted to draw fluid from the reservoir through the conduit.

21. The fixture insert of claim 12, wherein the porous portion wicks fluid from the conduit using a capillary action.

22. The fixture insert of claim 12, wherein the fluid comprises distilled water.

23. A method of testing a device, comprising:
    selecting a device to be tested;
    placing the device for test on a test fixture comprising a thermally conductive member comprising a mounting surface and a conduit, wherein the mounting surface comprises an aperture in fluid communication with the conduit and a porous portion disposed within the aperture of the mounting surface and having face that is substantially co-planar with the mounting surface of the thermally conductive member, the test fixture further comprising a fluid reservoir in fluid communication with the conduit;
    holding the device for test onto the thermally conducive member and into communication with test circuitry so that the porous portion draw fluid from the reservoir through the conduit to provide a fluid layer beneath the device for test;

electronically testing the device;

removing the device for test from the thermally conducive member; and removing excess fluid from the device for test.

24. The method of claim 23, wherein the device comprises a radio frequency (RF) semiconductor device.

25. The method of claim 23, wherein the step of placing the device for test on the test fixture comprises the use of a robotic device.

26. The method of claim 25, wherein the step of holding the device for test onto the thermally conductive member comprises the use of a robotic device.

27. The method of claim 23, wherein the step of removing excess fluid from the device for test comprises wiping the device against an absorbent material.

28. A method of heat sinking a device comprising, placing the device on a thermally conductive member comprising a mounting surface and a conduit, wherein the mounting surface comprises an aperture in fluid communication with the conduit and a porous portion disposed within the aperture of the mounting surface and having face that is substantially co-planar with the mounting surface of the thermally conductive member, the test fixture further comprising a fluid reservoir in fluid communication with the conduit.

29. The method of claim 28, further comprising holding the device onto the thermally conductive member so that the porous portion draws fluid from the reservoir through the conduit to provide a fluid layer beneath the device.

30. A semiconductor device for use in a circuit, wherein the semiconductor device was placed on a test fixture comprising a thermally conductive member comprising a mounting surface and a conduit, wherein the mounting surface comprises an aperture in fluid communication with the conduit and a porous portion disposed within the aperture of the mounting surface and having face that is substantially co-planar with the mounting surface of the thermally conductive member, the test fixture further comprising a fluid reservoir in fluid communication with the conduit and wherein the semiconductor device was held onto the thermally conducive member and into communication with test circuitry so that the porous portion would draw fluids from the reservoir through the conduit to provide a fluid layer beneath the device for test.

31. The semiconductor device of claim 30, wherein the semiconductor device is free from residue of non-water soluble thermal conductor.

32. The semiconductor of claim 31, wherein the non-water soluble thermal conductor comprises thermal grease.

* * * * *

UNITED STATES PATENT AND TRADEMARK OFFICE
CERTIFICATE OF CORRECTION

PATENT NO.     : 6,819,131 B2
DATED          : November 16, 2004
INVENTOR(S)    : Patrick Masterton et al.

It is certified that error appears in the above-identified patent and that said Letters Patent is hereby corrected as shown below:

Column 6,
Line 66, please delete "conducive" and insert -- conductive --.

Column 7,
Line 5, please delete "conducive" and insert -- conductive --.

Column 8,
Line 17, please delete "conducive" and insert -- conductive --.

Signed and Sealed this

Seventeenth Day of May, 2005

JON W. DUDAS
*Director of the United States Patent and Trademark Office*